(12) United States Patent
Zheng et al.

(10) Patent No.: US 8,598,848 B2
(45) Date of Patent: Dec. 3, 2013

(54) BATTERY END OF LIFE DETERMINATION

(75) Inventors: Guanghong Zheng, Westlake, OH (US); Peter F Hoffman, Avon, OH (US)

(73) Assignee: Eveready Battery Company, Inc., St Louis, MO (US)

( * ) Notice: Subject to any disclaimer, the term of this patent is extended or adjusted under 35 U.S.C. 154(b) by 706 days.

(21) Appl. No.: 12/746,529

(22) PCT Filed: Apr. 9, 2008

(86) PCT No.: PCT/US2008/004588
§ 371 (c)(1),
(2), (4) Date: Jun. 7, 2010

(87) PCT Pub. No.: WO2009/093999
PCT Pub. Date: Jul. 30, 2009

(65) Prior Publication Data
US 2010/0250164 A1    Sep. 30, 2010

Related U.S. Application Data

(60) Provisional application No. 61/023,651, filed on Jan. 25, 2008.

(51) Int. Cl.
*H01J 7/00* (2006.01)
*H01J 7/04* (2006.01)

(52) U.S. Cl.
USPC ........... 320/132; 320/127; 320/134; 320/136; 320/152; 320/157

(58) Field of Classification Search
CPC ...................................................... H02J 7/0031
USPC .......................................................... 320/132
See application file for complete search history.

(56) References Cited

U.S. PATENT DOCUMENTS

| | | | |
|---|---|---|---|
| 5,406,266 A * | 4/1995 | Mino et al. | 340/636.19 |
| 5,767,659 A | 6/1998 | Farley | |
| 6,191,557 B1 | 2/2001 | Gray et al. | |
| 2003/0069704 A1 | 4/2003 | Bean | |
| 2004/0220758 A1 * | 11/2004 | Barsoukov et al. | 702/63 |

OTHER PUBLICATIONS

Patent Cooperation Treaty (PCT), International Search Report and Written Opinion for Application No. PCT/US2008/004588, filed Apr. 9, 2008, mailed Oct. 24, 2008, European Patent Office, Netherlands.

* cited by examiner

*Primary Examiner* — Edward Tso
*Assistant Examiner* — Ahmed Omar
(74) *Attorney, Agent, or Firm* — Robert C. Baraona

(57) ABSTRACT

A method for determining an end of life of a battery includes determining a discharge capacity of the battery at a given moment in time, determining a discharge capacity at a functional endpoint of the battery, and determining a fuel remaining in the battery at the given moment in time as a function of both the discharge capacity at the given moment in time and the discharge capacity of the battery at the functional endpoint of the battery. The determined fuel remaining is indicative of an end of life of the battery.

27 Claims, 14 Drawing Sheets

BATTERY END OF LIFE DETERMINATION

RELATED APPLICATIONS

This application is a national stage entry of International Application No. PCT/US2008/004588, filed Apr. 9, 2008, which claims the benefit of U.S. Provisional Application No. 61/023,651, filed Jan. 25, 2008.

TECHNICAL FIELD

The following relates generally to determining an end of life of a battery.

BACKGROUND

Battery-powered appliances have become ubiquitous. In some instances, it is desirable to know when the end of the life of a battery(s) being used in a battery-powered appliance is approaching. For example, when using a battery-powered computer such as a laptop it is often useful to know when the end of the life of the battery is nearing so that a suitable measure can be taken. Examples of such measures include saving files, closing applications, powering down the system, providing external power, charging the battery, as well as other measures. Such measures may be manually or automatically performed. Some battery-powered appliances, such as laptops, may provide a visual indication of a remaining life of the battery and/or an audible indication when the estimated remaining life of the battery falls below a warning threshold.

Various approaches have been used to estimate the remaining life of a battery being used in a battery-powered appliance. Such approaches have been based on a closed circuit voltage (CCV), an open circuit voltage (OCV), impedance, change in current over time, change in voltage over time, and/or capacity removed during discharge (coulomb counting). Unfortunately, there are many factors that affect battery discharge behavior. For instance, battery temperature, discharge rate, discharge mode (current, power or load), discharge intermittency, cell-to-cell variation, initial charge state of the battery, discharge characteristics, temperature change during discharge, battery chemistry, as well as other factors. The above-noted approaches generally are not well suited for one or more of these factors, particularly with respect to certain primary battery chemistries such as $Li/FeS_2$. As a consequence, these approaches have been known to overestimate or underestimate the remaining life of a battery to a functional endpoint. Thus, in some instances a battery-powered appliance may turn off prior to any measure being taken, while in other instances, such measures may be prematurely performed.

In view of the above, there is an unresolved need for a battery end of life determiner that addresses the above and/or other factors.

SUMMARY

Aspects of the application address the above matters, and others.

In one aspect, a method for determining an end of life of a battery includes determining a discharge capacity of the battery at a given moment in time, determining a discharge capacity at a functional endpoint of the battery, and determining a fuel remaining in the battery at the given moment in time as a function of both the discharge capacity at the given moment in time and the discharge capacity of the battery at the functional endpoint of the battery. The determined fuel is indicative of the end of life of the battery.

In another aspect, a method for determining an end of life of a battery includes determining an end of life of a battery based on both a discharge capacity at a functional endpoint of the battery and a discharge capacity at a given time, wherein the discharge capacity at a given time is determined via coulomb counting.

In another aspect, a method for determining an end of life of a battery includes determining an end of life of a battery based on both a discharge capacity at a functional endpoint of the battery and a discharge capacity at a given time, wherein the discharge capacity at a given time is determined based on both a closed circuit voltage of the battery and a temperature about the battery.

In another aspect, a battery powered appliance includes memory that stores battery fuel gauging instructions, a battery receiving region configured to receive at least one battery, wherein the battery receiving region includes at least one electrical contact that electrically communicates with a battery inserted into the battery receiving region, and a processor in operative communication with the memory and the at least one electrical contact of the battery receiving region. The processor causes execution of the battery fuel gauging instructions, which estimates a remaining life of the battery installed in the battery receiving region based at least in part on information about the battery obtained via the at least one electrical contact. The processor invokes at least one action when the determined life of the battery is below a preset fuel level. The battery fuel gauging instructions determine the life of the battery as a function of both a discharge capacity of the battery and an expected discharge capacity at a functional endpoint of the battery. In one example, the battery consists of a lithium-based primary cell and, more preferably, a lithium-iron disulfide cell. However, other battery chemistries can be employed.

In another aspect, the battery powered appliance also includes at least one light source, wherein the at least one light source is illuminated with power supplied by the battery.

Those skilled in the art will recognize still other aspects of the present application upon reading and understanding the attached description.

BRIEF DESCRIPTION OF THE DRAWINGS

The application is illustrated by way of example and not limitation in the figures of the accompanying drawings, in which like references indicate similar elements and in which.

DETAILED DESCRIPTION

The following relates to determining an end of life of a battery (battery fuel gauging). Such determination can be used with various battery-powered appliances such as lighting appliances (e.g., flashlights, table lamps, etc.) and non-lighting electrical appliances (e.g., games, cellular phones, battery life extenders which use primary batteries to recharge one or more secondary batteries on a separate device, digital cameras, computers, etc.). In one instance, the determined end of life of the battery can be presented (e.g., visually, audibly, etc.) so that an operator of the appliance can suitably act (including do nothing) based on the determined remaining life of the battery. In another instance, electrical circuitry may invoke a suitable act (including do nothing) based on the determined end of life of the battery. Other actions and/or responses are also contemplated.

It is to be appreciated that the approaches for determining the end of life of a battery discussed herein may provide for accurate and/or reliable fuel gauging with respect to various factors that may influence the determination of the remaining life of a battery. Such factors include, but are not limited to, one or more of battery temperature, battery discharge rate, discharge mode, battery usage intermittency, design variations of a battery, the initial state (e.g., new or used) of the battery, discharge characteristics (e.g., one step or two step), battery health (e.g., good or bad), and/or other factors.

Figure 1:
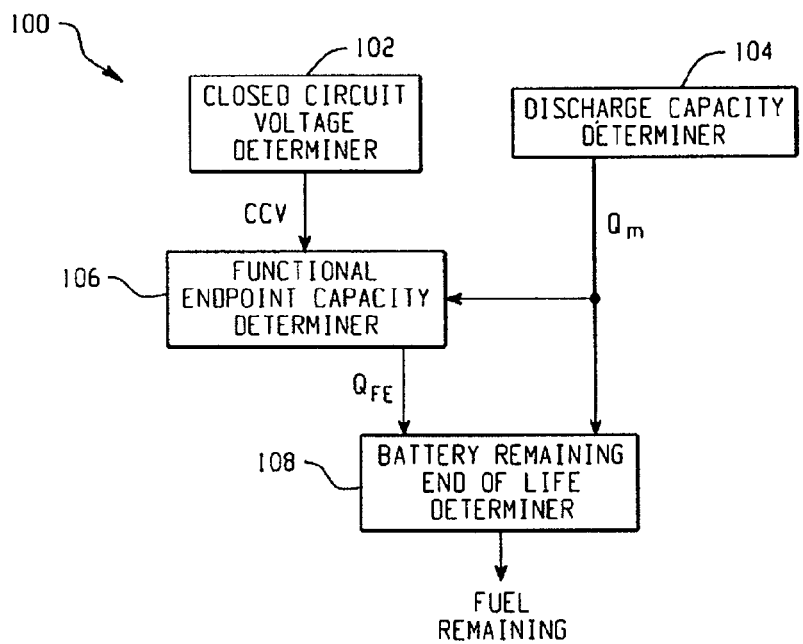
FIG. 1 illustrates an example battery fuel gauging system that determines an end of life of a battery.

Initially referring to FIG. 1, a block diagram of a battery fuel gauging system 100 that determines a remaining life of a battery (battery fuel remaining) in a battery-powered appliance is illustrated. As shown, the system 100 includes a closed circuit voltage determiner 102 that can determine a closed circuit voltage (CCV), or the loaded voltage, of a battery at any given time. The system 100 also includes a discharge capacity determiner 104 that can determine a discharge capacity ($Q_m$) of the battery at a given time. In the illustrated example, the discharge capacity determiner 104 determines $Q_m$ via coulomb counting, which is know in the art. However, other techniques for measuring, estimating, predicting, etc. or otherwise determining the discharge capacity can also be used. One alternative method would involve understanding the magnitude of the load being driven and apply this load separately to a battery experimentally in order to understand the discharge capacity for such a battery under such a load.

The system 100 also includes a functional endpoint capacity determiner 106 that determines a capacity at a functional endpoint ($Q_{FE}$) of the battery. In the illustrated example, the functional endpoint capacity determiner 106 determines $Q_{FE}$ based at least in part on the determined CCV and the determined $Q_m$. The system 100 further includes a battery remaining life determiner 108 that determines a remaining life of the battery (the fuel remaining). In the illustrated example, the battery remaining life determiner 108 determines the remaining of the battery based at least in part on $Q_m$ and $Q_{FE}$. However, in other instances other known techniques can be used.

As briefly noted above, in the illustrated example the functional endpoint capacity determiner 106 determines $Q_{FE}$ based on the determined CCV and $Q_m$. By way of non-limiting example, in one instance the endpoint capacity determiner 106 determines $Q_{FE}$ based on Equation 1.

$$Q_{FE} = (A \times Q_m^2) + (B \times CCV^2) + (C \times Q_m \times CCV) + (D \times Q_m) + (E \times CCV) + F \qquad \text{Equation 1}$$

wherein A, B, C, D, E and F are coefficients, or fitting constants. In this example, Equation 1 is a polynomial of degree two (2), or a quadratic equation. However, linear and/or higher order equations, such as cubic, quartic, quintic, etc. equations, are also contemplated herein. For sake of brevity and clarity, only an example quadratic equation is presented herein.

The coefficients A, B, C, D, E and F can be variously determined. For example, the coefficients can be empirically determined, or based on experiment and/or observation. For instance, the empirical data produced by measuring and/or recording various operating characteristics of a battery over time as the battery is discharging. Theoretical, statistical, probabilistic, predictive, and/or other techniques may also be employed. A non-limiting example of a set of suitable coefficients includes, but is not limited to, the coefficients in Equation 2.

$$Q_{FE} = (19966 \times Q_m^2) + (-2.733 \times 10^{-4} \times CCV^2) + (-4.909 \times Q_m \times CCV) + (60232 \times Q_m) + (-7.278 \times CCV) + (-42449), \qquad \text{Equation 2}$$

wherein $Q_{FE}$ and $Q_m$ area in terms of milli amperes (mAh), and CCV is in terms of in Volts. It is noted that the above coefficients have been tuned for a Li/FeS$_2$ battery. However, it is to be appreciated that other coefficients can be used with a Li/FeS$_2$ battery and/or the coefficients can be tuned based on other battery chemistries. This approach is expected to have particular applicability to Li/FeS$_2$ systems insofar as this chemistry can be used in a wide range of consumer devices and the chemistry does not lend itself to many presently known fuel gauging regimes used for other consumer applications and/or primary batteries in general and alkaline batteries in particular. As noted above, in the illustrated example the battery life determiner 108 determines the remaining life of the battery based on $Q_m$ and $Q_{FE}$. In one non-limiting instance, the battery life determiner 108 determines the end of life of the battery (the determined fuel remaining) based on Equation 3.

$$\text{Determined Fuel Remaining} = 1 - (Q_m / Q_{FE}), \qquad \text{Equation 3}$$

which can be in terms of the percentage of the fuel remaining or in other terms such as actual remaining time or the number of pictures able to betaken in the camera.

It is to be understood that other parameters and/or variables may also be included in the determination. For example, in another instance temperature, battery type, battery chemistry, etc. may additionally or alternatively be included in the determination.

Figure 2:
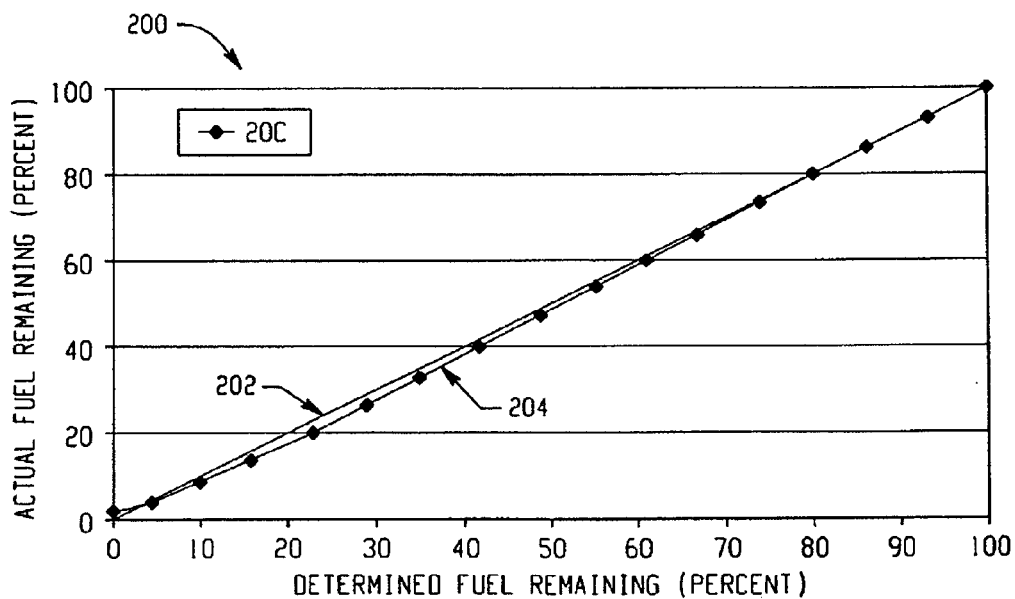
FIG. 2 illustrates a graph with a curve of the actual remaining life of a battery versus the determined remaining life of the battery using the system of FIG. 1.

FIG. 2 shows a graph 200 illustrating a curve of the actual remaining fuel in a battery versus the determined remaining fuel, determined using Equations 1-3. In the graph 200, the y-axis represents the actual fuel remaining in a battery expressed as a percentage of the total useful fuel, and the x-axis represents the determined fuel remaining in the battery expressed as a percentage of the total useful fuel. A reference line 202 shows points in the graph 200 where the actual and determined fuel remaining are equal. A curve 204 illustrates the actual fuel remaining versus the determined fuel remaining at a temperature of about twenty (20) degrees Celsius. Note that the curve 204 representing the determined fuel remaining substantially tracks the reference line 202 across the range of actual fuel levels.

Figure 3:
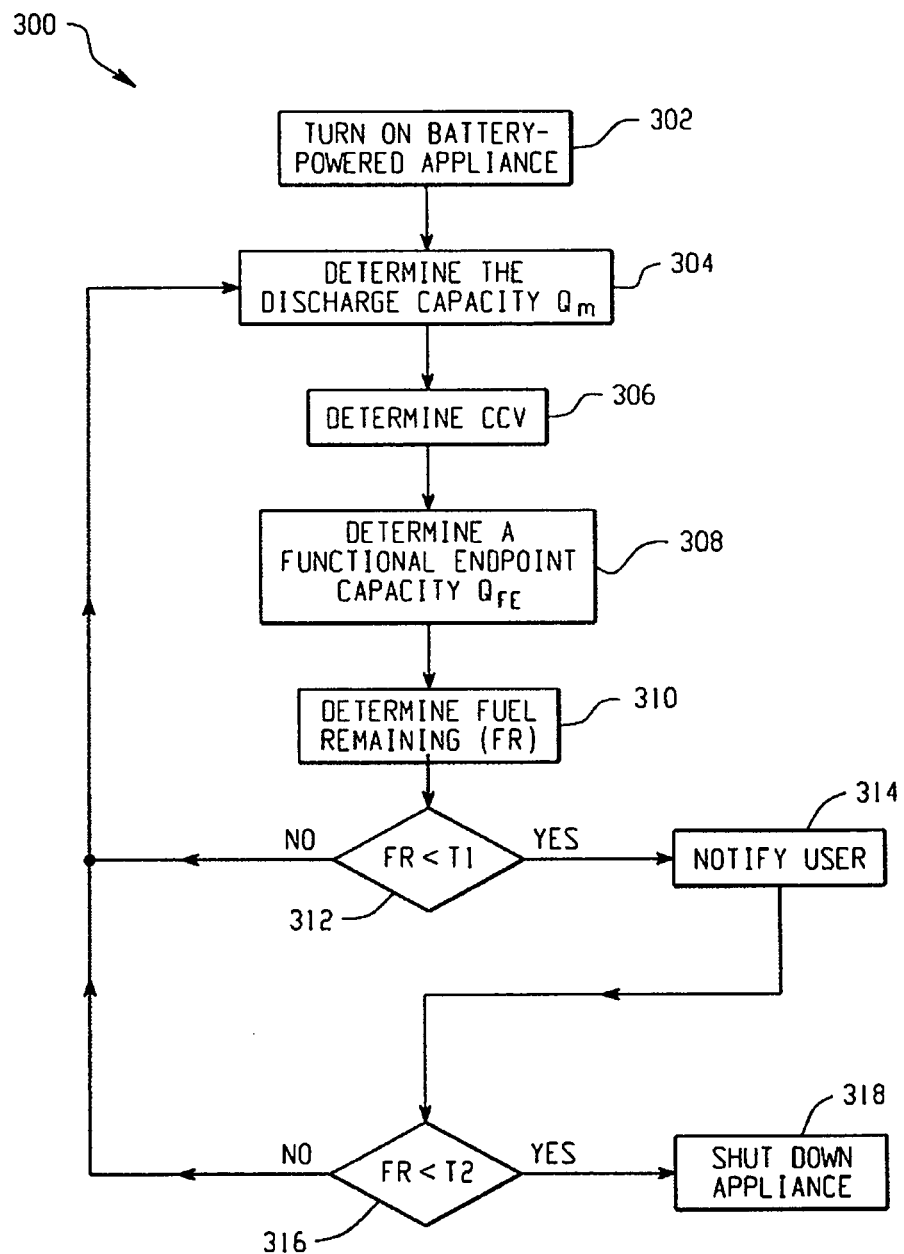
FIG. 3 illustrates an example method of fuel gauging with the system of FIG. 1.

FIG. 3 illustrates a flow diagram 300 for determining the remaining life of a battery based on the approach described in connection with FIGS. 1 and 2. It is to be appreciated that the flow diagram 300 is described through a series of acts. However, it is to be understood that in various instances one or more of the acts may be omitted and/or one or more acts may be added, and that the ordering of the acts is for explanatory purpose and is not limiting.

At 302, the battery-powered appliance is turned on. At 304, a discharge capacity $Q_m$ of the battery is determined. In one non-limiting instance, $Q_m$ is determined via measurement or calculation. For example the discharge capacity of a AA sized $LiFeS_2$ battery is one value at a low discharge rate and a somewhat lesser value at a higher discharge rate. The same loads applied to a $ZnMnO_2$ (alkaline) battery will yield different values. These values can be known through experiment work and can be made available to the method at 304. At 306, a CCV of the battery is determined. In one non-limiting instance, the CCV is determined through measurement such as by means of an analog to digital converter ADC or other suitable circuit to one skilled in the art. At 308, a functional endpoint capacity ($Q_{FE}$) of the battery is determined. As noted above, $Q_{FE}$ can be determined as a function of CCV and $Q_m$ as in Equations 1 and 2. At 310, the fuel remaining (FR) is determined. As noted above, the fuel remaining (FR) can be determined as a function of $Q_m$ and $Q_{FE}$ as in Equation 3. The determined fuel remaining (FR) can be presented (e.g., visually and/or audibly) or otherwise utilized. For instance, the determined fuel remaining (FR) may be continuously presented or presented on demand.

At 312, the determined fuel remaining (FR) is compared against a first threshold T1, which may be set in accordance with a first fuel remaining level. If the determined fuel remaining (FR)>T1, then operation loops back to 304. However, if FR<T1, then at 314 a first action is invoked. An example of a suitable action is to invoke presentation (e.g., visual and/or audible) of a message for an operator. The message may indicate the battery life has fallen below T1 (low battery warning), the determined remaining fuel (e.g. as a percentage of remaining fuel, as an estimated amount of time remaining before the battery reaches the end of its life), etc. Then, at 316, the determined fuel remaining (FR) is compared against a second threshold T2, which may be set in accordance with a second fuel remaining level. If the determined fuel remaining (FR)>T2, then operation loops back to 304. However, if FR<T2, then at 318 a second action is invoked. An example of a suitable action is to shutdown the battery-powered appliance. This may include saving state information prior to or concurrently with shutting down the battery-powered appliance.

It is to be appreciated that acts 312-316 are optional and may be omitted. In such an instance, the determined fuel remaining (FR) can still be presented (e.g., visually and/or audibly) or otherwise utilized as noted above.

Optionally, an initial check can be performed to see whether the battery should be replaced. In such a case, a message may be provided to the operator and the appliance may be shut down without performing acts 304-316.

Figure 4:
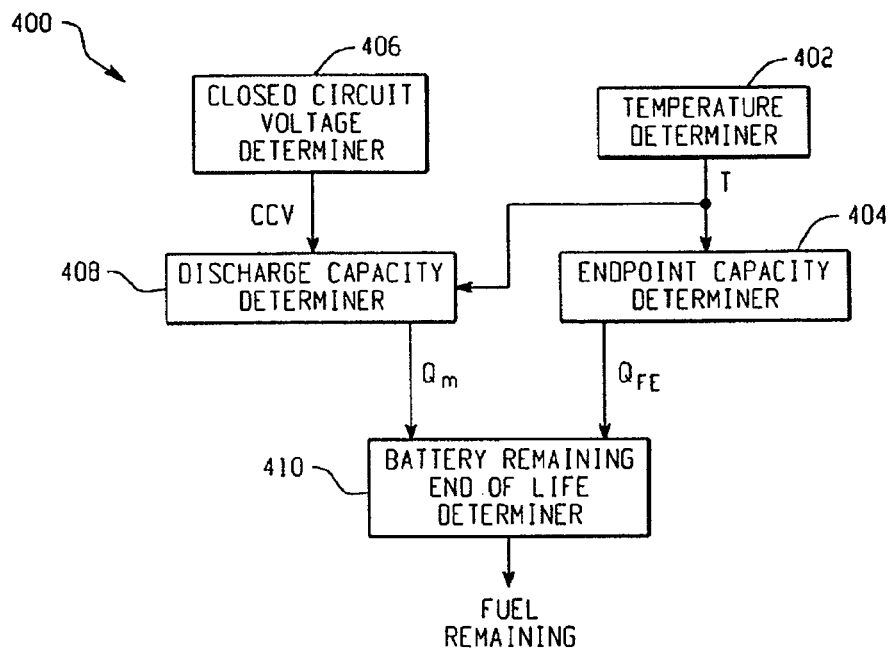
FIG. 4 illustrates another example battery fuel gauging system that determines an end of life of a battery.

Turning now to FIG. 4, a block diagram of another battery fuel gauging system 400 that determines an end of life of a battery (fuel remaining) in a battery-powered appliance is illustrated.

As shown, the system 400 includes a temperature determiner 402 that determines a temperature about the battery. The temperature determiner 402 may include a sensor that measures the temperature T and/or other components that predicts estimates, receives, obtains, or otherwise determine the temperature, T. The system 400 further includes an endpoint capacity estimator 404 that determines an expected discharge capacity to the functional endpoint of the battery ($Q_{FE}$) at any given time. In the illustrated example, $Q_{FE}$ is a function of the determined temperature, T. The system 400 also includes a closed circuit voltage determiner 406 that determines the closed circuit voltage (CCV) of a battery at any given time. The system 400 also includes a discharge capacity determiner 408 that determines a discharge capacity ($Q_m$) of the battery at any given time. In the illustrated example, $Q_m$ is a function of the determined CCV and temperature, T. The system further includes a battery remaining life determiner 410 that determines an end of life of the battery (the remaining fuel). In the illustrated example, the fuel remaining is a function of the determined $Q_m$ and $Q_{FE}$.

As noted above, in the illustrated example the endpoint capacity determiner 404 determines $Q_{FE}$ based on the determined CCV and T. By way of non-limiting example, in one instance the endpoint capacity determiner 404 determines $Q_{FE}$ based on Equation 4.

$$Q_{FE}=(A\times T^3)+(B\times T^2)+(C\times T)+D, \quad \text{Equation 4}$$

wherein A, B, C and D are coefficients, or fitting constants. In this example, Equation 4 is a polynomial of degree three (3), or a cubic equation. However, linear, second order, and/or higher order equations are also contemplated herein. The coefficients A, B, C, and D can be variously determined as discussed above in connection with Equation 1. An example of suitable coefficients include, but are not limited to, the coefficients in Equation 5.

$$Q_{FE}=(3.11\times10^{-3}\times T^3)+(-0.7892\times T^2)+(37.33\times T)+2295, \quad \text{Equation 5}$$

wherein $Q_{FE}$ are in terms of mAh, and T is in terms of degrees Celsius. As with Equation 2, the above coefficients have been tuned for a $Li/FeS_2$ battery for a specific application, and it is to be understood that other coefficients can be used with a $Li/FeS_2$ battery and/or the coefficients can be tuned based on two or more different battery chemistries.

The discharge capacity determiner 408 determines $Q_m$ based on the determined CCV and T. By way of non-limiting example, in one instance the discharge capacity determiner 408 determines $Q_m$ based on Equation 6.

$$Q_m=(A\times CCV\times T^2)+(B\times CCV^2)+(C\times T)+(D\times T\times CCV)+(E\times CCV)+(F\times T)+G, \quad \text{Equation 6}$$

wherein A, B, C, D, E, F and G are coefficients, or fitting constants. In this example, Equation 6 is a quadratic equation; however, linear and/or higher order equations are also contemplated herein. The coefficients A-G can be variously determined as discussed above in connection with Equation 1. An example of suitable coefficients include, but are not limited to, the coefficients in Equation 7.

$$Q_m=(2.464\times CCV\times T^2)+(-11047\times CCV^2)+(-3.086\times T)+(44.44\times T\times CCV)+(16269\times CCV)+(-5.837\times T)+(-2333), \quad \text{Equation 7}$$

wherein $Q_m$ is in terms of mAh, CCV is in terms of volts, and T is in terms of degrees Celsius. Once again, the coefficients have been tuned for a Li/FeS$_2$ battery, but other coefficients can be used with a Li/FeS$_2$ battery and/or the coefficients can be tuned based on two or more different battery chemistries.

As noted above, in the illustrated example the remaining battery life determiner 410 determines a remaining life of the battery based on $Q_m$ and $Q_{FE}$. In one non-limiting instance, the battery life determiner 410 determines the end of the life of the battery (or the determined fuel remaining) based on Equation 8.

$$\text{Determined Fuel Remaining} = 1 - (Q_m/Q_{FE}), \quad \text{Equation 8}$$

which can be in terms of the percentage or in other terms.

Figure 5:
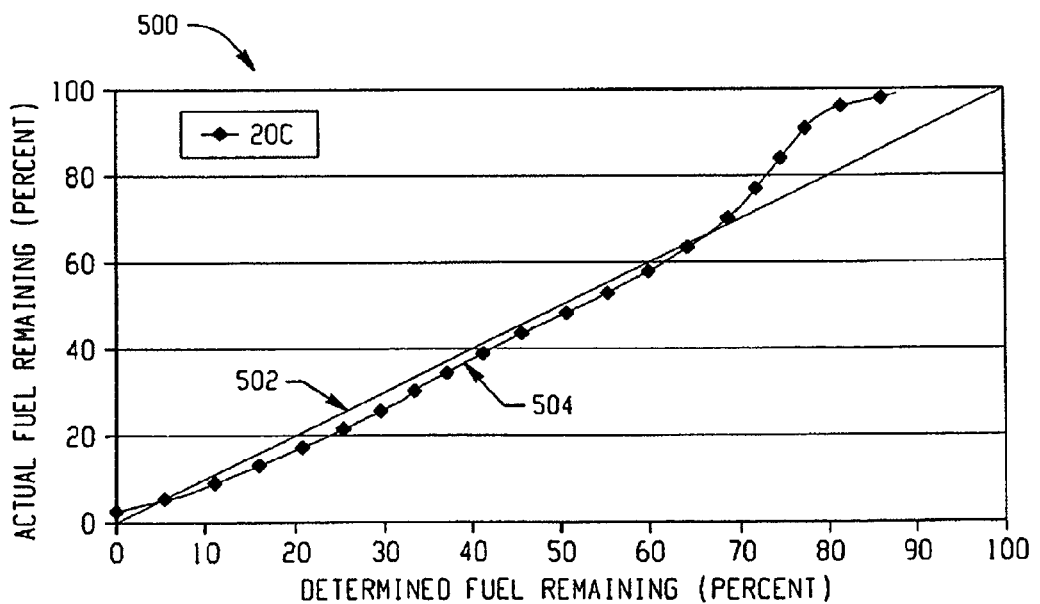
FIG. 5 illustrates a graph with a curve of the actual end of life of a battery versus the determined end of life of the battery using the system of FIG. 4.

FIG. 5 shows a graph 500 with a curve of the actual remaining fuel in a battery versus the determined remaining fuel, determined using Equations 4-8. In the graph 500, the y-axis represents the actual fuel remaining in a battery expressed as a percentage of the total useful fuel, and the x-axis represents the determined fuel remaining in the battery expressed as a percentage of the total useful fuel. A reference line 502 shows points in the graph where the actual and determined fuel remaining are equal. A curve 504 illustrates the actual fuel remaining versus the determined fuel remaining at a temperature of about twenty (20) degrees Celsius. Similar to the curve 204 in the graph 200, the curve 504 representing the determined fuel remaining tracks the reference line 502 across the range of actual fuel levels. Also note that the determined fuel remaining substantially tracks the reference line 502 near the actual end of the life of the battery, which the region of the graph close to zero (0) percent fuel remaining.

Figure 6:
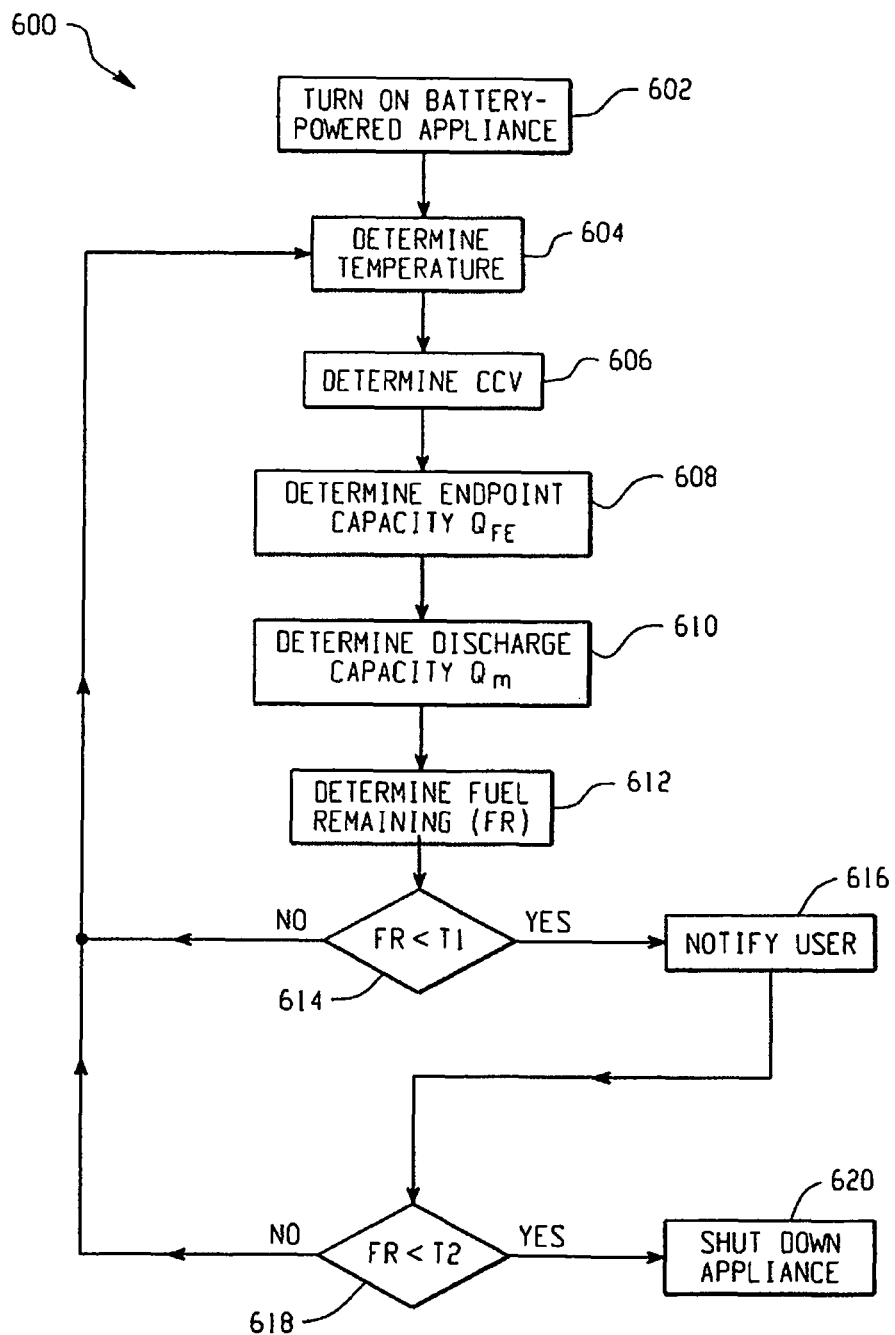
FIG. 6 illustrates an example method of fuel gauging with the system of FIG. 4.

FIG. 6 illustrates a flow diagram 600 for determining the remaining life of a battery based on the approach described in connection with FIGS. 4 and 5. As with FIG. 3, the flow diagram 600 is described through a non-limiting series of acts, which may be added to, subtracted from and/or otherwise modified.

At 602, the battery-powered appliance it turned on. At 604, a temperature T is determined. This can be accomplished through a temperature sensor or otherwise. At 606, a CCV of the battery is determined. In one non-limiting instance, the CCV is determined through measurement. At 608, an endpoint capacity $Q_{FE}$ of the battery is determined. As noted above, $Q_{FE}$ can be determined as a function of T as in Equations 4 and 5. At 610, a discharge capacity $Q_m$ of the battery is determined. As noted above, $Q_m$ can be determined as a function of CCV and T as in Equations 6 and 7. At 612, a determined fuel remaining (FR) of the battery is determined. As noted above, the fuel remaining (FR) can be determined as a function of $Q_{FE}$ and $Q_m$ as in Equation 8. The determined fuel remaining (FR) can be presented (e.g., visually and/or audibly) or otherwise utilized. For instance, the determined fuel remaining (FR) may be continuously presented or presented on demand.

At 614, the determined fuel remaining (FR) is compared against a first threshold T1, which may be set in accordance with a first fuel remaining level. If the determined fuel remaining (FR)>T1, then operation loops back to 604. However, if FR<T1, then at 616 a first action is invoked. An example of a suitable action is to invoke presentation (e.g., visual and/or audible) of a message for an operator. The message may indicate the battery life has fallen below T1 (low battery warning), the determined remaining fuel (e.g. as a percentage of remaining fuel, as an estimated amount of time remaining before the battery reaches the end of its life, etc.). Then, at 618, the determined fuel remaining (FR) is compared against a second threshold T2, which may be set in accordance with a second fuel remaining level. If the determined fuel remaining (FR)>T2, then operation loops back to 604. However, if FR<T2, then at 620 a second action is invoked. An example of a suitable action is to shutdown the battery-powered appliance. This may include saving state information prior to or concurrently with shutting down the battery-powered appliance.

It is to be appreciated that acts 614-620 are optional and may be omitted. In such an instance, the determined fuel remaining (FR) can still be presented (e.g., visually and/or audibly) or otherwise utilized as noted above.

Optionally, an initial check can be performed to see whether the battery should be replaced. In such a case, a message may be provided to the operator and the appliance may be shut down prior to performing acts 604-620.

Figure 7:
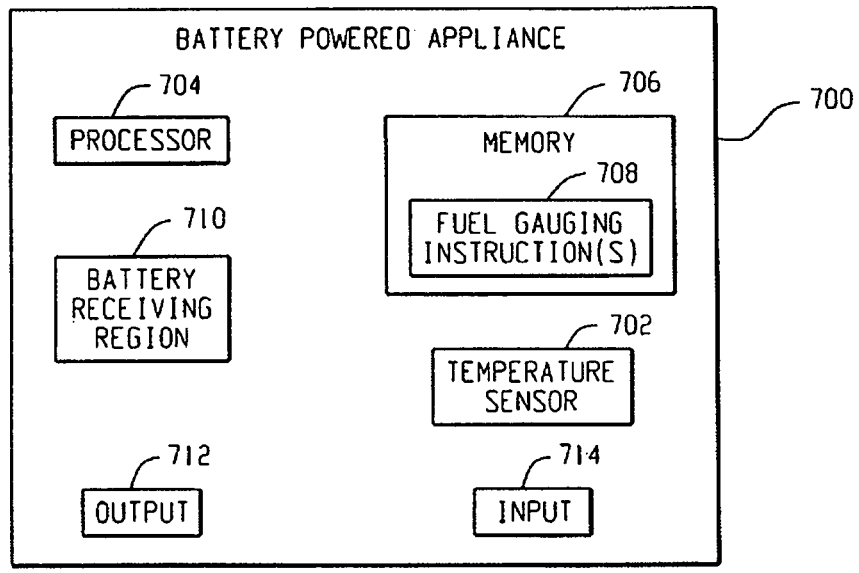
FIG. 7 illustrates an example battery powered electrical appliance.

FIG. 7 illustrates an example battery powered appliance 700, which can use the fuel gauging approaches described herein. The battery powered appliance 700 includes a processor 704 such as a micro-processor, central processing unit (CPU), or other processing unit. A memory 706 can be used to store one or more fuel gauging instructions 708 such as those described herein as well as other data. For example, one or more sets of coefficients for the Equations herein may also be stored in the memory 706. In one instance, at least a first set of coefficients is tuned to a first battery chemistry and at least a second set of coefficients is turned to a second battery chemistry. In the illustrated example, the processor 704 causes execution of the one or more fuel gauging instructions 708.

A battery receiving region 710 is configured to receive one or more batteries. The battery receiving region 710 may accept individual primary (non-rechargeable) batteries, individual secondary (chargeable) batteries, a battery pack, or alternately individual primary, individual second, or a battery pack. The fuel gauging techniques herein can be used with essential any chemistry battery, including, but not limited to lithium iron disulfide (Li/FeS$_2$), nickel metal hydride (NiMH), nickel oxyhydroxide (NiOOH), zinc manganese dioxide (Zn/MnO$_2$), carbon zinc (CZn), zinc-manganese dioxide), Lithium ion (Li-Ion), nickel-cadmium (NiCd), zinc air, zinc air prismatic, as well as other chemistries. Suitable size batteries include AAA, AA, C, D, N, 9-volt, button cell, and lantern and any other sizes of batteries.

An output component 712 such as a display, one or more LEDs, a speaker, etc. presents information in a human understandable format. An input component 714 allows an operator to provide input to the electrical appliance. This input component could be a dedicated "fuel gauge request" pushbutton or another user actuated input that has another function such as the on/off switch or mode switch for the device. This includes turning the appliance on and off, invoking one or more actions, etc. A temperature sensor 702 may be included to determine the temperature. In instances where the fuel gauging does note use temperature, the temperature sensor 702 can be omitted.

Optionally, a battery chemistry identifier may also be included. In such instance, the battery chemistry can also be utilized for fuel gauging. Battery chemistry identification can be made by means of a user input such as a selector switch or selection choice in the processor code and memory. Alternately, the battery chemistry identification can be made without the user input by means of an automatic measurement of the battery under one or more various load imparted on the battery by the device. This battery response to changes in load in conjunction with battery open circuit voltage and closed circuit voltage can be used to determine the battery chemistry. Once the battery chemistry is identified either by manual or automatic means, a proper set of fuel gauging coefficients can be used in the fuel gauging calculation.

In operation, the processor 704 communicates with the memory 706 and invokes execution of the one or more fuel gauging instructions 708. Various parameters associated with the batteries are obtained, and a fuel remaining value is determined. The determination may be re-computed over time, for example, continuously, periodically, aperiodically, on demand, and/or otherwise. The output component 712 may present the determined fuel remaining continuously or upon request, for example, by an operator of the appliance via the input component 714, when a pre-set criterion is satisfied, and/or otherwise. Other information such as messages may also be presented. In other instance, fuel gauge information can be communicated over a network, wirelessly, etc. In yet another instance, the processor 704 may additionally or alternatively enter varied modes of operation based on the fuel gauge information, such as entering a low power mode, sleep mode, etc.

Figure 8:
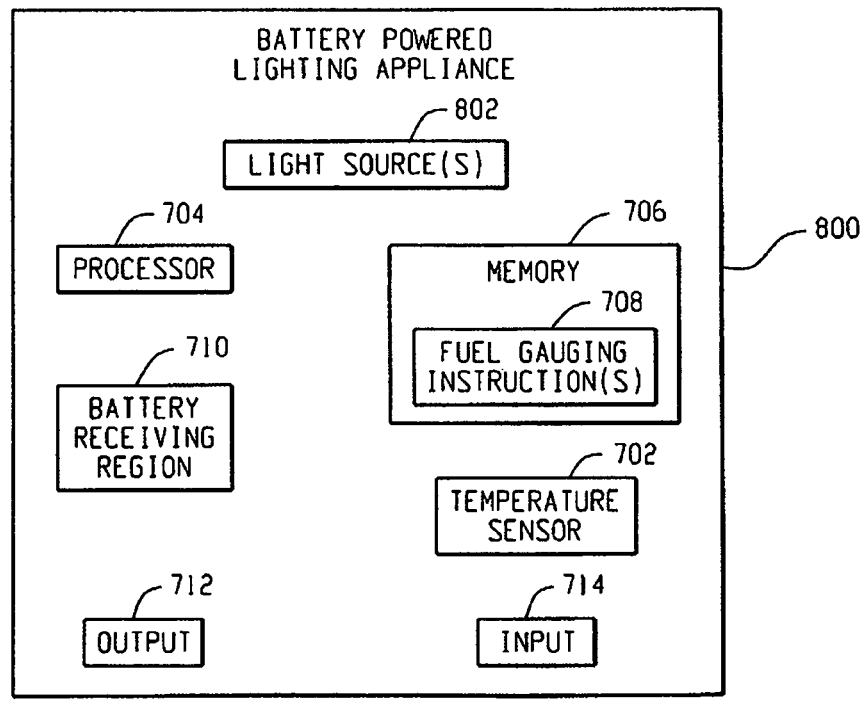
FIG. 8 illustrates an example battery powered lighting appliance.

FIG. 8 illustrates an example battery powered lighting appliance 800, which can use the fuel gauging approaches described herein. The battery powered lighting appliance 800 is similar to the battery powered appliance 700, except that the battery powered lighting appliance 800 also include one or more light sources 802, which are powered by the battery(s) in the battery receiving region 710 or other power. The one or more light sources 802 may include various types of light sources including, but not limited to, a light emitting diode (LED), an incandescent light, a florescent light, etc.

The light sources 802 can be employed to indicate fuel gauging information by, for example, flashing, dimming, etc. Further, the processor can initiate a low power mode wherein light produced by the light sources 802 is reduced according to the fuel gauging information.

As noted above, various factors may affect the determination of the end of life of the battery, and such factors include one or more of battery temperature, battery discharge rate, discharge mode, battery usage intermittency, variations between batteries of the same chemistry, the initial state (e.g., new or used) of the battery, discharge characteristics (e.g., one step or two step), battery health (e.g., good or bad), and/or other factors. Note that the additional lighting source(s) can serve as the load discussed in the section regarding chemistry detection. The following discussion discusses the fuel gauging approaches herein in relation to these factors. For illustrative purposes, the approaches described herein are discussed in connection with graphs in which the y-axis represents the actual fuel remaining and the x-axis represents the determined fuel remaining. Note that the curves may change based on the coefficients and/or other parameters.

Temperature

Figure 9:
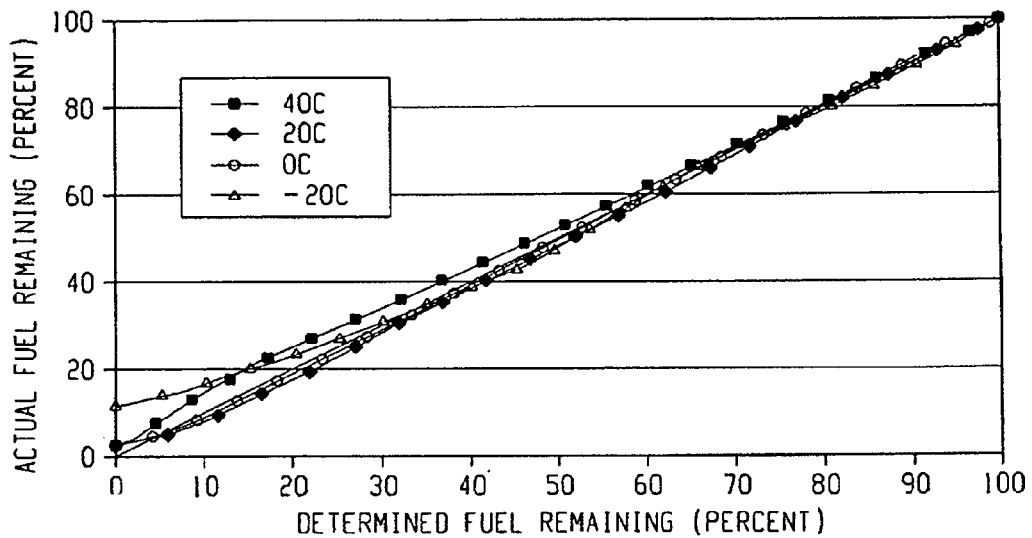
FIGS. 9 and 10 depict graphs illustrating fuel gauging over a range of temperatures.
Figure 10:
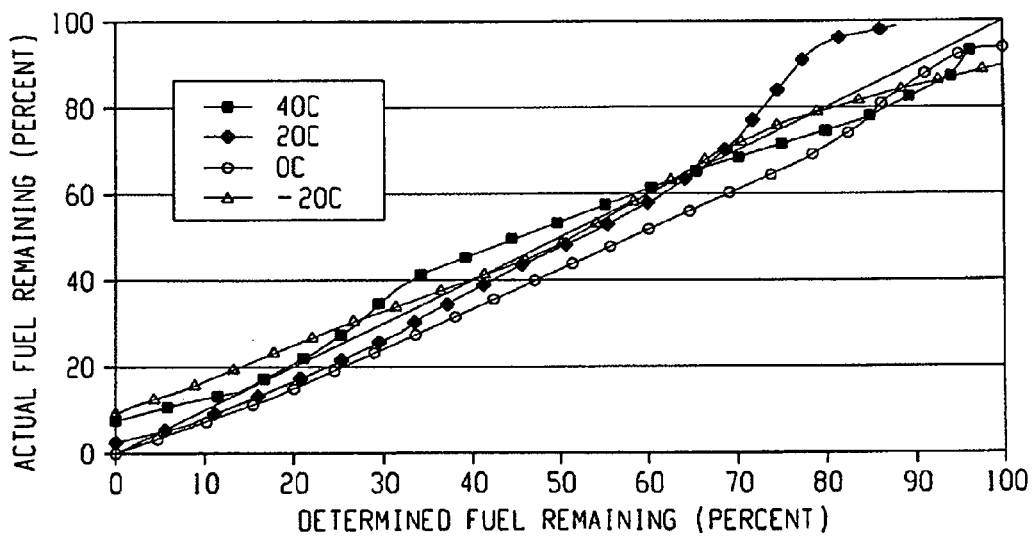

FIGS. 9 and 10 show graphs with curves of actual fuel remaining versus determined fuel remaining over a range of negative twenty (−20) degrees Celsius to forty (40) degrees Celsius for the approaches discussed in connection with FIGS. 1-6.

In FIG. 9, the curves are based on the approach discussed in connection with FIGS. 1-3. The temperatures for the curves are about negative twenty (−20) degrees Celsius, zero (0) degrees Celsius, twenty (20) degrees Celsius, and forty (40) degrees Celsius. Not that the curves substantially track along points where the actual and determined fuel remaining is equal.

In FIG. 10, the curves are based on the approach discussed in connection with FIGS. 4-6. Likewise, the temperatures for the curves are about negative twenty (−20) degrees Celsius, zero (0) degrees Celsius, twenty (20) degrees Celsius, and forty (40) degrees Celsius. Again, note that the curves track along points where the actual and determined fuel remaining is about equal.

Discharge Intermittency

Figure 11:
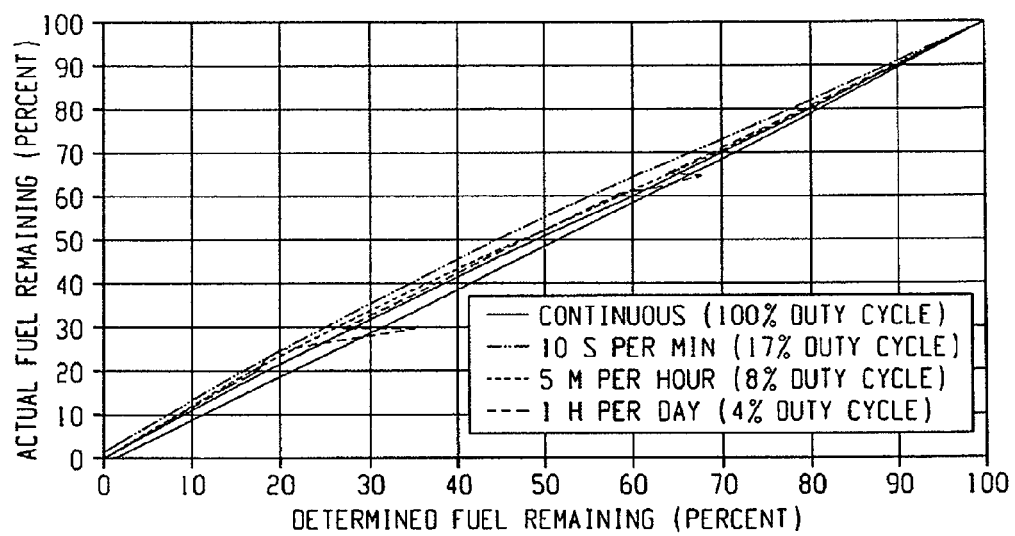
FIG. 11 depicts a graph illustrating fuel gauging for different discharge intermittencies.

FIG. 11 shows a graph with curves of actual fuel remaining versus determined fuel remaining for different discharge intermittencies using the approach discussed in connection with FIGS. 1-3. The discharge rate for the curves is continuous, ten second per minute (10 s/min.), five minute per hour (5 min/hr), and one hour per day (1 hr/day). Note that the curves substantially track along points where the actual and determined fuel remaining is about equal.

Cell Design Variation

Figure 12:
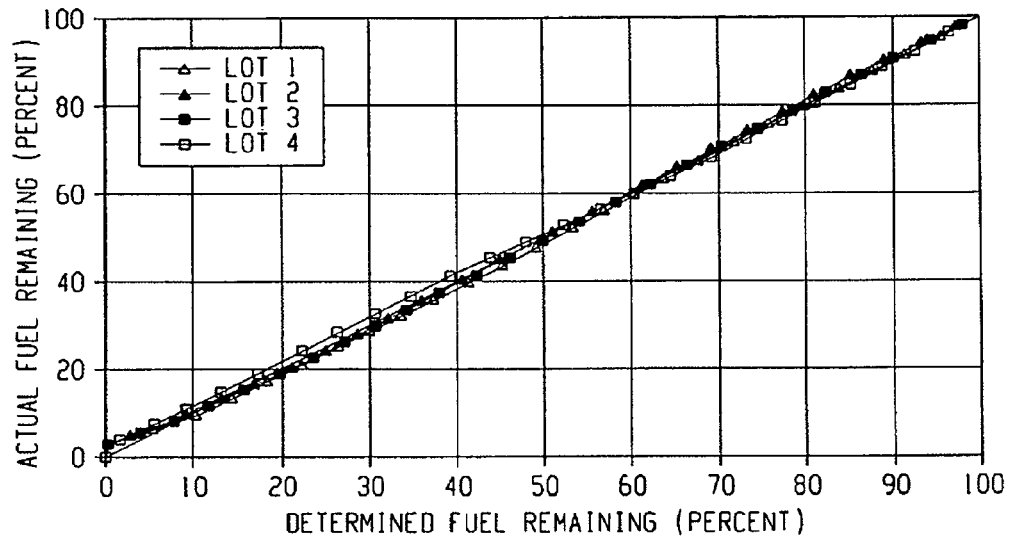
FIGS. 12 and 13 depict graphs illustrating fuel gauging across cell design variations.
Figure 13:
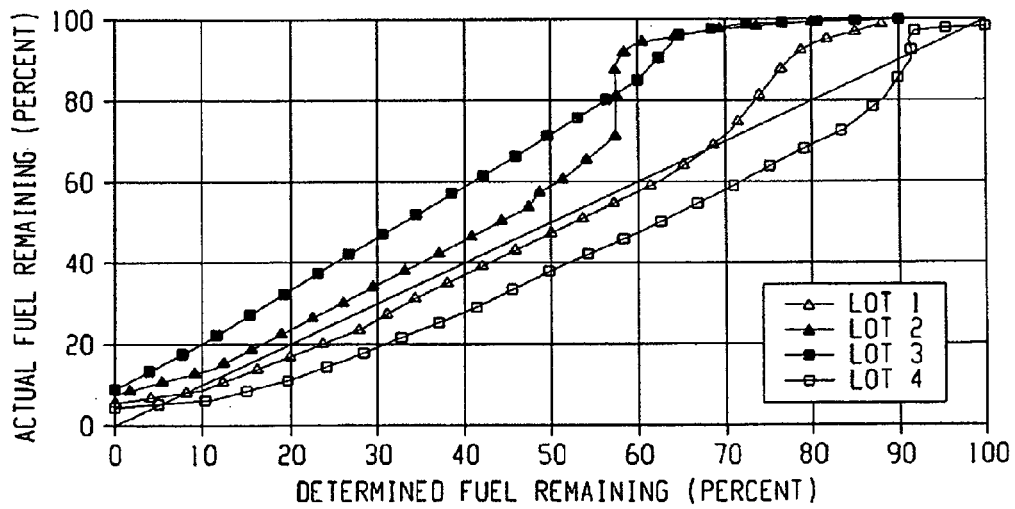

As known, a manufacturer may change a cell's design over time, for example, to improve performance, reliability, etc. FIGS. 12 and 13 show graphs with curves of actual fuel remaining versus determined fuel remaining for different cell designs respectively for the approaches discussed in connection with FIGS. 1-6. In FIG. 12, the curves, which correspond to the approach of FIGS. 1-3, substantially track along points where the actual and determined fuel remaining is about equal. In FIG. 13, the curves, which correspond to the approach of FIGS. 4-6, track along points, although more closely along points representing the end of the battery's life. In one instance, this portion of the graph is more important it is often desirable to apprise the user and/or perform an action prior to the battery discharging passed its functional capacity.

Partially Discharged Cells

Figure 14:
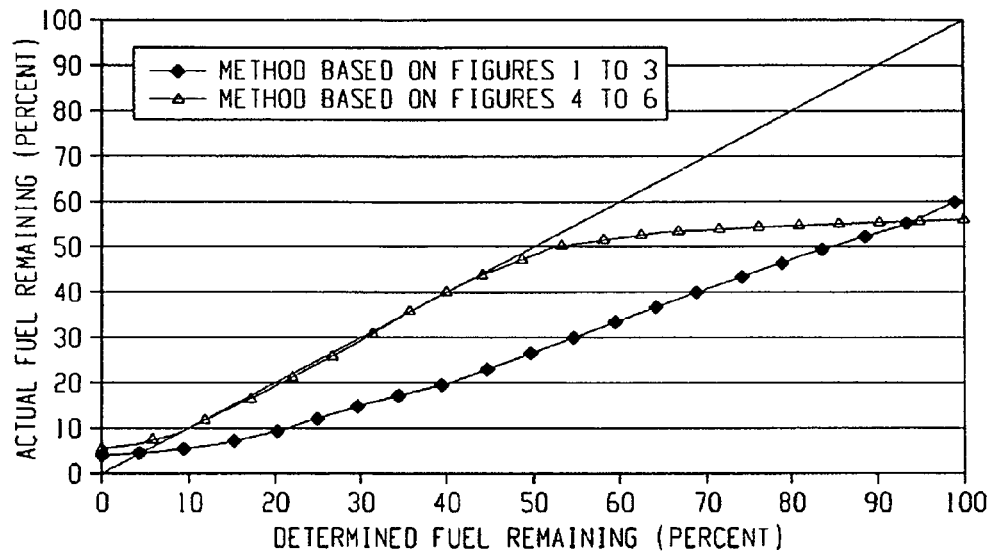
FIG. 14 depicts a graph illustrating fuel gauging for partially discharged cells.

FIG. 14 shows a graph with example curves of actual fuel remaining versus determined fuel remaining for a partially discharged battery for the approaches discussed in connection with FIGS. 1-6. Note that the curves track well with the points near the end of the battery's life. For the illustrated curves, assume that the cell was discharged at 500 mA for 2 Hr to remove 1000 milli-Ampere hours (mAh) capacity, and was rested for 10 days before it being discharged again at ten (10) degrees Celsius.

Two-Stepped Discharge

Figure 15:
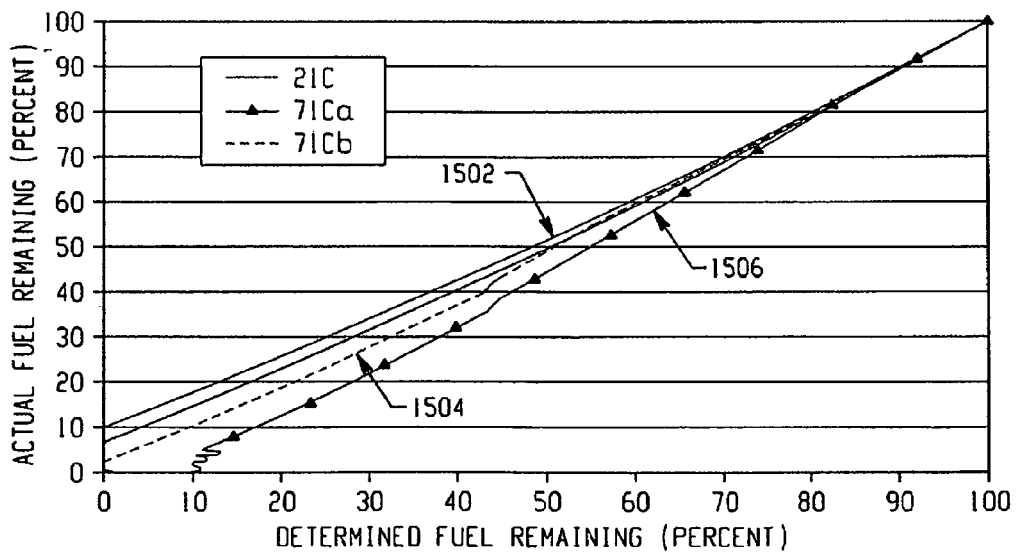
FIG. 15 depicts a graph illustrating fuel gauging for a one stepped and a two stepped discharge.

The discharge behavior of some cells includes two discharge plateaus. For example, it is known that the discharge behavior of a $Li/FeS_2$ cell includes two discharge plateaus when the cells are discharged at high temperature and/or very low rates. FIG. 15 shows that the curves corresponding to the approach of FIGS. 1-3 track along points where the actual and determined fuel remaining is about equal for both a one stepped discharge 1502 and a two-stepped discharge 1504 and 1506.

Discharge Rate

Figure 16:
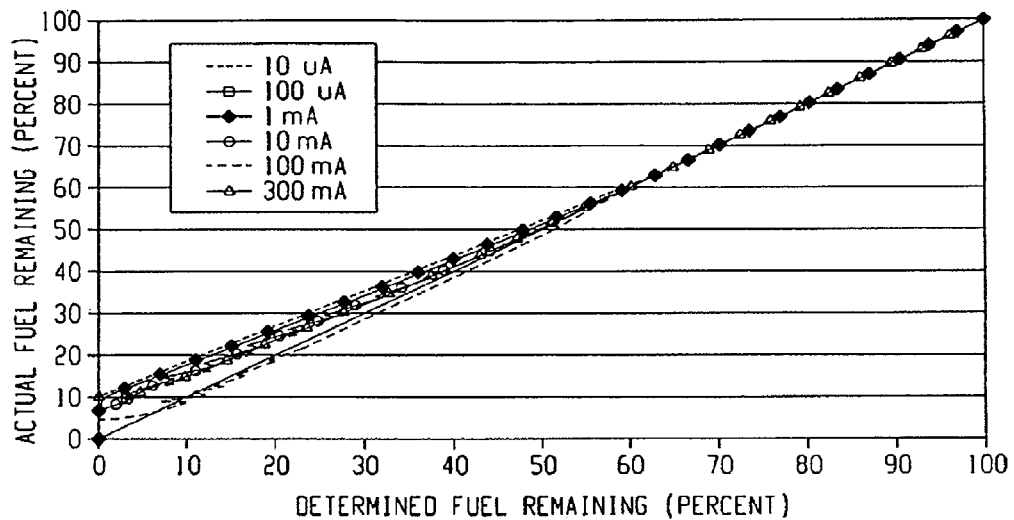
FIG. 16 depicts a graph illustrating fuel gauging across different discharge rates.

In some applications such as smoke detectors, the expected battery life could be more than ten (10) years. The discharge curves at such low discharge rates may very different from the discharge curves at relatively higher rate or intermediate rates. As shown in FIG. 16, the approaches herein track along points where the actual and determined fuel remaining is about equal at low rates. The illustrated curves cover discharge rate from 10 uA and 300 mA.

Temperature Change During Discharge

Figure 17:
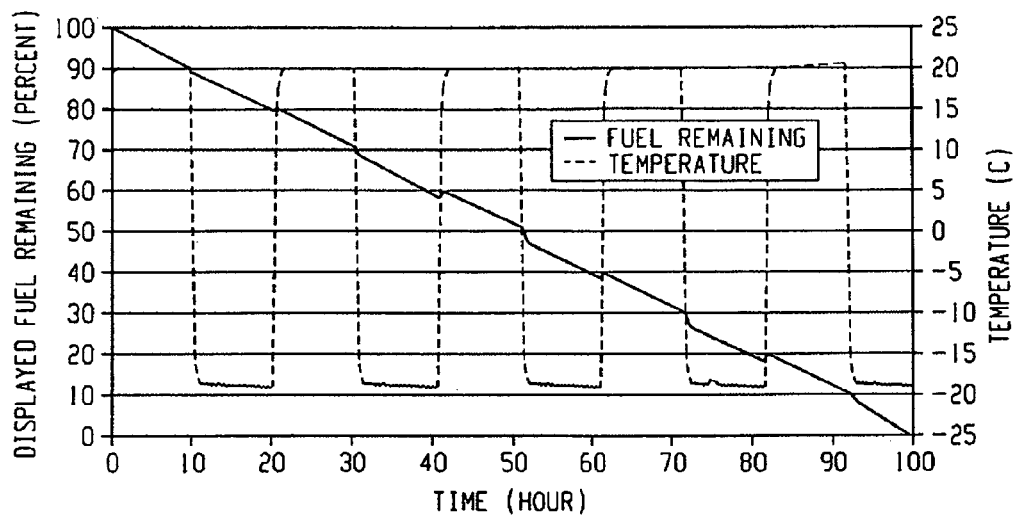
FIG. 17 depicts a graph illustrating fuel gauging for a varying temperature.

FIG. 17 shows the affect of changing temperature on the determined fuel remaining. For FIG. 17, the temperature change varied between about twenty (20) degrees Celsius and negative twenty (−20) degrees Celsius every 6 hours for a 50 mA continuous discharge. Note that the temperature variation has a marginal affect on the determined fuel remaining.

Incorrect Battery Chemistry

Figure 18:
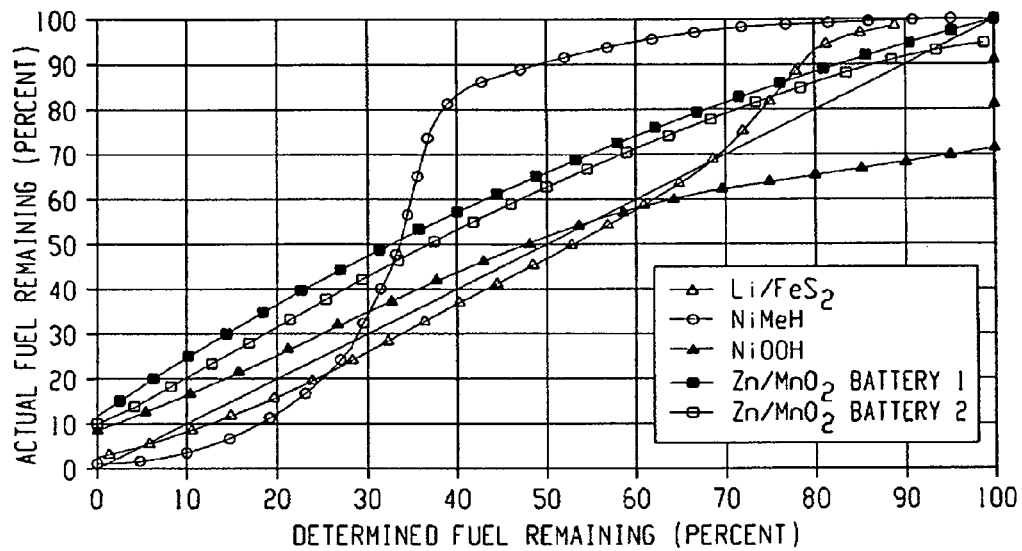
FIGS. 18 and 19 depict graphs illustrating fuel gauging based on incorrect battery chemistry.
Figure 19:
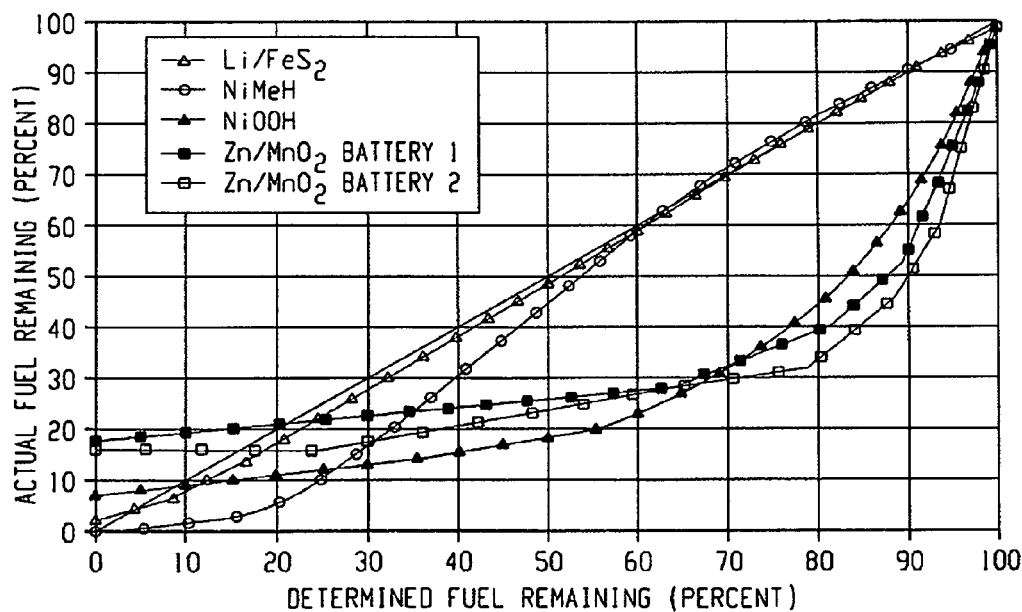
Figure 20:
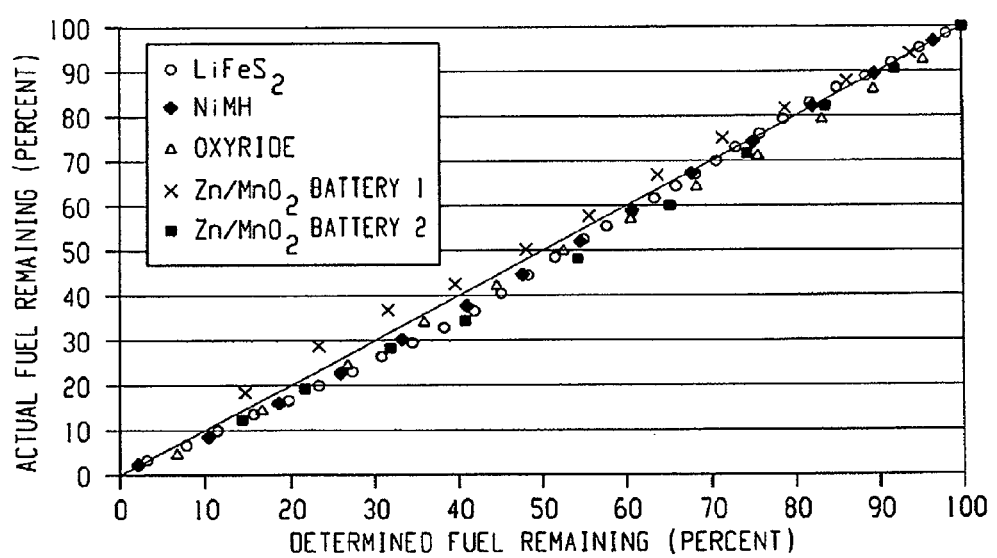
FIG. 20 depicts a graph illustrating fuel gauging based on incorrect battery chemistry.
Figure 21:
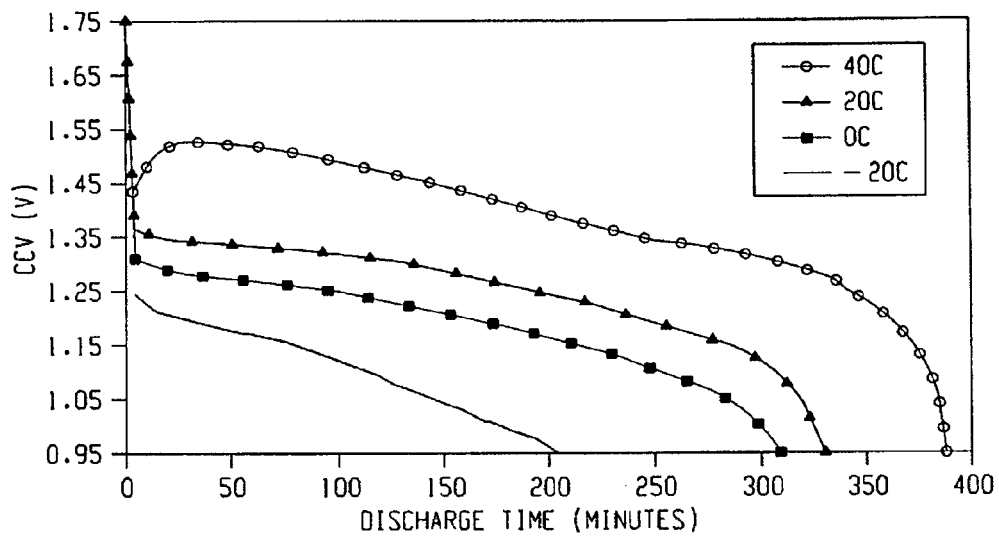
FIGS. 21-24 depict graphs illustrating discharge capacity curves.
Figure 22:
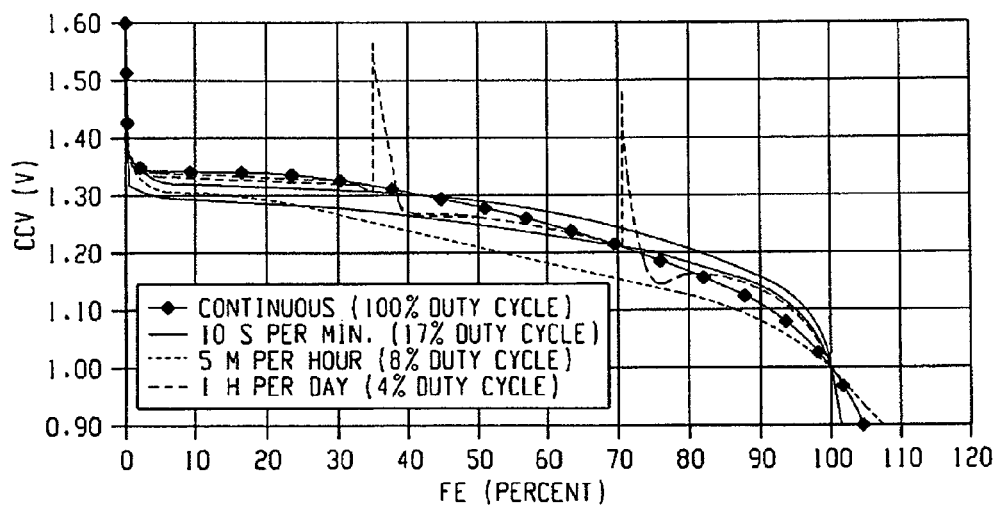
Figure 23:
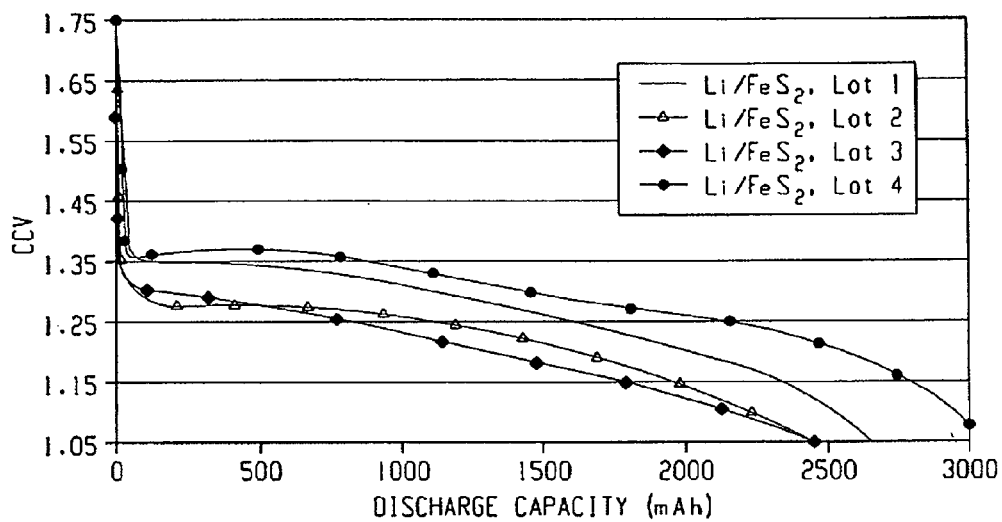
Figure 24:
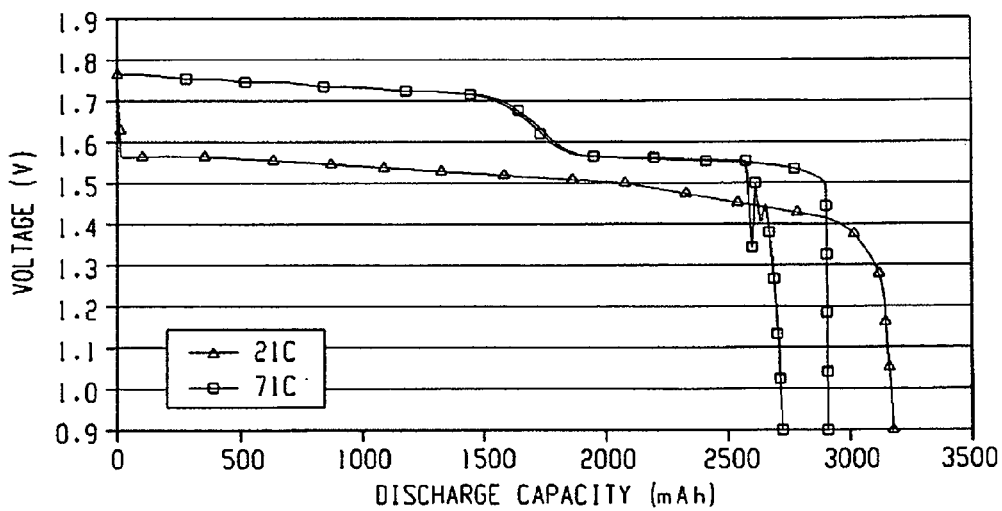

FIGS. 18 and 19 show the affect of battery chemistry on the remaining fuel. For FIGS. 18 and 19, assume that the coefficients for the fuel gauging equations have been tuned particularly for a Lithium (Li/FeS$_2$) battery. The curves represent the response for a nickel metal hydride (NiMH), an Oxyride, Zinc Manganese Dioxide (Zn/MnO$_2$), and a Lithium (Li/FeS$_2$) battery. FIG. 18 shows curves for the fuel gauging approach of FIGS. 4-6, and FIG. 19 shows curves for the fuel gauging approach of FIGS. 1-3. Note that if a low battery warning is given at ten (10) percent of displayed determined fuel remaining, the actual fuel remaining may be in a range of five (5) percent to twenty (20) percent. In FIG. 20, the coefficients used for each curve are tuned to the corresponding battery chemistry, using the approach of FIGS. 1-3. Note that the batteries are accurately fuel gauged from the beginning to the end of discharge. FIGS. 21-24 show examples of actual discharge curves. Note that the discharge curves could be very different.

The application has been described with reference to the various embodiments. Modifications and alterations will occur to others upon reading the application. It is intended that the invention be construed as including all such modifications and alterations, including insofar as they come within the scope of the appended claims and the equivalents thereof.

What is claimed is:

1. A method for determining an end of life of a battery, comprising:
   determining a discharge capacity of the battery at a given moment in time;
   determining a discharge capacity at a functional endpoint of the battery; and
   determining a fuel remaining in the battery at the given moment in time as a function of both the discharge capacity at the given moment in time and the discharge capacity of the battery at the functional endpoint of the battery, wherein the determined fuel remaining is indicative of an end of life of the battery.

2. The method of claim 1, further including determining a fuel remaining in the battery as a function on the following:

$$1 - \left( \frac{\text{discharge capacity at the given moment in time}}{\text{discharge capacity of the battery at the functional endpoint}} \right).$$

3. The method of claim 1, further including determining the discharge capacity at the functional endpoint of the battery as a function of both the determined discharge capacity of the battery at the given moment in time and a closed circuit voltage of the battery.

4. The method of claim 1, further including determining a closed circuit voltage of the battery, wherein the discharge capacity at the functional endpoint of the battery is a function of both the discharge capacity of the battery at the given moment in time and the closed circuit voltage of the battery.

5. The method of claim 1, wherein the discharge capacity at the given moment in time is determined via coulomb counting.

6. The method of claim 1, further including:
   determining a temperature of about the battery;
   determining the discharge capacity at the functional endpoint of the battery as a function of the determined temperature.

7. The method of claim 1, further including:
   determining a closed circuit voltage of the battery;
   determining a temperature of about the battery;
   determining the discharge capacity of the battery at the given moment in time as a function of both the determined closed circuit voltage and the determined temperature.

8. The method of claim 1, further including outputting a signal when the determined fuel remaining is below a preset fuel threshold, wherein the signal is indicative of the fuel remaining.

9. The method of claim 8, wherein the signal is at least one of a visual and an audio message.

10. The method of claim 1, wherein the method is executed in a battery-powered device, and further including automatically shutting down: the battery-powered device when the determined fuel remaining is below a preset fuel threshold.

11. The method of claim 10, wherein the battery-powered device uses power from the battery to operate at least one electrical component of the battery powered device.

12. The method of claim 10, wherein the battery-powered device includes at least one light source and the power from the battery is used to illuminate the light source.

13. The method of claim 1, further including:
   determining a chemistry of the battery; and
   determining the fuel remaining in the battery as a function of all three of the discharge capacity at the functional endpoint of the battery, the discharge capacity of the battery, and the chemistry of the battery.

14. The method of claim 1, wherein the method is employed to fuel gauge a battery of an electrical device, and further including:
   providing a low battery warning when the determined fuel remaining in the battery is below a first preset set fuel level; and
   powering down the electrical device when the determined fuel remaining in the battery is below a second preset set fuel level, wherein the first preset threshold is greater than the second preset threshold.

15. A method for determining an end of life of a battery, comprising:
   determining an end of life of a battery based on both a discharge capacity at a functional endpoint of the battery and a discharge capacity at a given time, wherein the discharge capacity at a given time is determined via coulomb counting;
   wherein the end of life of the battery is a function of:

$1-(Q_m/Q_{FE})$ wherein $Q_m$ is the discharge capacity at the given time and $Q_{FE}$ is the discharge capacity at the functional endpoint of the battery; and
   wherein the discharge capacity at the functional endpoint is computed based on a closed circuit voltage of the battery and the discharge capacity at a given time.

16. The method of claim 15, wherein the discharge capacity at the functional endpoint is a function of:

$(A \times Q_m^2)+(B \times CCV^2)+(C \times Q_m \times CCV)+(D \times Q_m)+(E \times CCV)+F;$ wherein A, B, C, D, E and F are fitting constants, $Q_m$ is the discharge capacity at the given time, and CCV is the closed circuit voltage of the battery.

17. A method for determining an end of life of a battery, comprising:
   determining an end of life of a battery based on both a discharge capacity at a functional endpoint of the battery and a discharge capacity at a given time, wherein the discharge capacity at a given time is determined based on both a closed circuit voltage of the battery and a temperature about the battery; and wherein the end of life of the battery is a function of:

$1-(Q_m/Q_{FE})$, wherein $Q_m$ is the discharge capacity at the given time and $Q_{FE}$ is the discharge capacity at the functional endpoint of the battery.

18. The method of claim 17, wherein the discharge capacity at the functional endpoint is a function of:

$(A \times T^3)+(B \times T^2)+(C \times T)+D$, wherein A, B, C and D are fitting constants and T is the temperature.

19. The method of claim 17, wherein the discharge capacity at the given moment in time is a function of:

$(A \times CCV \times T^2)+(B \times CCV^2)+(C \times T)+(D \times T \times CCV)+(E \times CCV)+(F \times T)+G$, wherein A, B, C, D, E, F and G are fitting constants, CCV is the closed circuit voltage and T is the temperature.

20. A battery powered appliance, comprising:
memory that stores battery fuel gauging instructions;
a battery receiving region configured to receive at least one battery, wherein the battery receiving region includes at least one electrical contact that electrically communicates with a battery inserted into the battery receiving region; and
a processor in operative communication with the memory and the at least one electrical contact of the battery receiving region;
wherein the processor causes execution of the battery fuel gauging instructions, which determines a remaining life of the battery installed in the battery receiving region based at least in part on information about the battery obtained via the at least one electrical contact, and the processor invokes at least one action when the determined remaining life of the battery is below a preset fuel level; and
wherein the battery fuel gauging instructions determine the remaining life of the battery as a function of both a discharge capacity of the battery and an expected discharge capacity at a functional endpoint of the battery.

21. The battery powered appliance of claim 20, further including at least one light source, wherein the at least one light source is illuminated with power supplied by the battery.

22. The battery powered appliance of claim 20, further including an output component that outputs a signal indicative of the determined remaining life of the battery.

23. The battery powered appliance of claim 20, wherein the at least one action includes at least one of outputting a signal indicative of the determined remaining life of the battery or powering down the battery powered appliance.

24. The battery powered appliance of claim 20, further including a battery chemistry determiner that determines a chemistry of the battery in electrical communication with the at least one electrical contact of the battery receiving region, wherein the memory also stores at least two sets of battery fuel gauging coefficients employed in connection with the battery fuel gauging instructions, wherein the at least two sets of coefficients are tuned to two different battery chemistries, and the set of coefficients employed is based on the determined battery chemistry.

25. The battery powered appliance of claim 20, wherein the at least one battery consists essentially of a lithium-based primary electrochemical cell.

26. The battery powered appliance of claim 25, wherein the at least one battery consists essentially of a lithium-iron disulfide electrochemical cell.

27. The battery powered appliance of claim 20, wherein the battery response to changes in load in conjunction with battery open circuit voltage and closed circuit voltage are used to determine the battery chemistry.

* * * * *